United States Patent
Stoek et al.

(10) Patent No.: US 11,699,640 B2
(45) Date of Patent: Jul. 11, 2023

(54) POWER SEMICONDUCTOR MODULE FOR PCB EMBEDDING, POWER ELECTRONIC ASSEMBLY HAVING A POWER MODULE EMBEDDED IN A PCB, AND CORRESPONDING METHODS OF PRODUCTION

(71) Applicant: Infineon Technologies AG, Neubiberg (DE)

(72) Inventors: Thomas Stoek, Buxtehude (DE); Frank Daeche, Unterhaching (DE); Chee Voon Tan, Seremban (MY)

(73) Assignee: Infineon Technologies AG, Neubiberg (DE)

(*) Notice: Subject to any disclaimer, the term of this patent is extended or adjusted under 35 U.S.C. 154(b) by 17 days.

(21) Appl. No.: 17/353,047

(22) Filed: Jun. 21, 2021

(65) Prior Publication Data
US 2022/0406692 A1    Dec. 22, 2022

(51) Int. Cl.
*H01L 23/495*    (2006.01)
*H01L 23/00*    (2006.01)
(Continued)

(52) U.S. Cl.
CPC .... *H01L 23/49537* (2013.01); *H01L 21/4825* (2013.01); *H01L 21/4842* (2013.01); *H01L 23/49524* (2013.01); *H01L 24/33* (2013.01); *H01L 24/83* (2013.01); *H01L 24/97* (2013.01); *H05K 1/185* (2013.01);
(Continued)

(58) Field of Classification Search
CPC ............ H05K 1/185; H05K 1/186; H05K 3/34–3494; H05K 3/4007–4015; H05K 2203/04–0485; H01L 2224/40155–40165; H01L 2224/40225–4024; H01L 23/12–15; H01L 2224/16245–1626; H01L 2224/32245–3226; H01L 2224/48245–4826; H01L 23/49541–49565; H01L 23/49838–49844; H01L 23/49575; H01L 23/49534; H01L 23/49822; H01L 23/4985; H01L 23/49861; H01L 23/49582;
(Continued)

(56) References Cited

U.S. PATENT DOCUMENTS 9,437,516 B2    9/2016    Otremba et al.
2015/0064844 A1*    3/2015    Mahler ............... H01L 24/84
                                                                    438/107

* cited by examiner

*Primary Examiner* — Julio J Maldonado
*Assistant Examiner* — Stanetta D Isaac
(74) *Attorney, Agent, or Firm* — Murphy, Bilak & Homiller, PLLC

(57) ABSTRACT

A power module for PCB embedding includes: a leadframe; a power semiconductor die with a first load terminal and control terminal at a first side of the die and a second load terminal at the opposite side, the second load terminal soldered to the leadframe; a first metal clip soldered to the first load terminal and forming a first terminal of the power module at a first side of the power module; and a second metal clip soldered to the control terminal and forming a second terminal of the power module at the first side of the power module. The leadframe forms a third terminal of the power module at the first side of the power module, or a third metal clip is soldered to the leadframe and forms the third terminal. The power module terminals are coplanar within +/−30 μm at the first side of the power module.

17 Claims, 18 Drawing Sheets

(51) Int. Cl.
*H01L 21/48* (2006.01)
*H05K 1/18* (2006.01)
*H05K 3/00* (2006.01)

(52) U.S. Cl.
CPC ........ *H01L 23/49513* (2013.01); *H01L 24/05* (2013.01); *H01L 24/06* (2013.01); *H01L 24/32* (2013.01); *H01L 2224/05647* (2013.01); *H01L 2224/06181* (2013.01); *H01L 2224/32245* (2013.01); *H01L 2224/33181* (2013.01); *H01L 2224/83203* (2013.01); *H01L 2224/83385* (2013.01); *H01L 2224/83815* (2013.01); *H05K 3/0035* (2013.01); *H05K 3/0038* (2013.01); *H05K 3/0047* (2013.01)

(58) Field of Classification Search
CPC ....... H01L 23/49866–49888; H01L 23/49586; H01L 23/49894; H01L 23/14; H01L 21/561
See application file for complete search history.

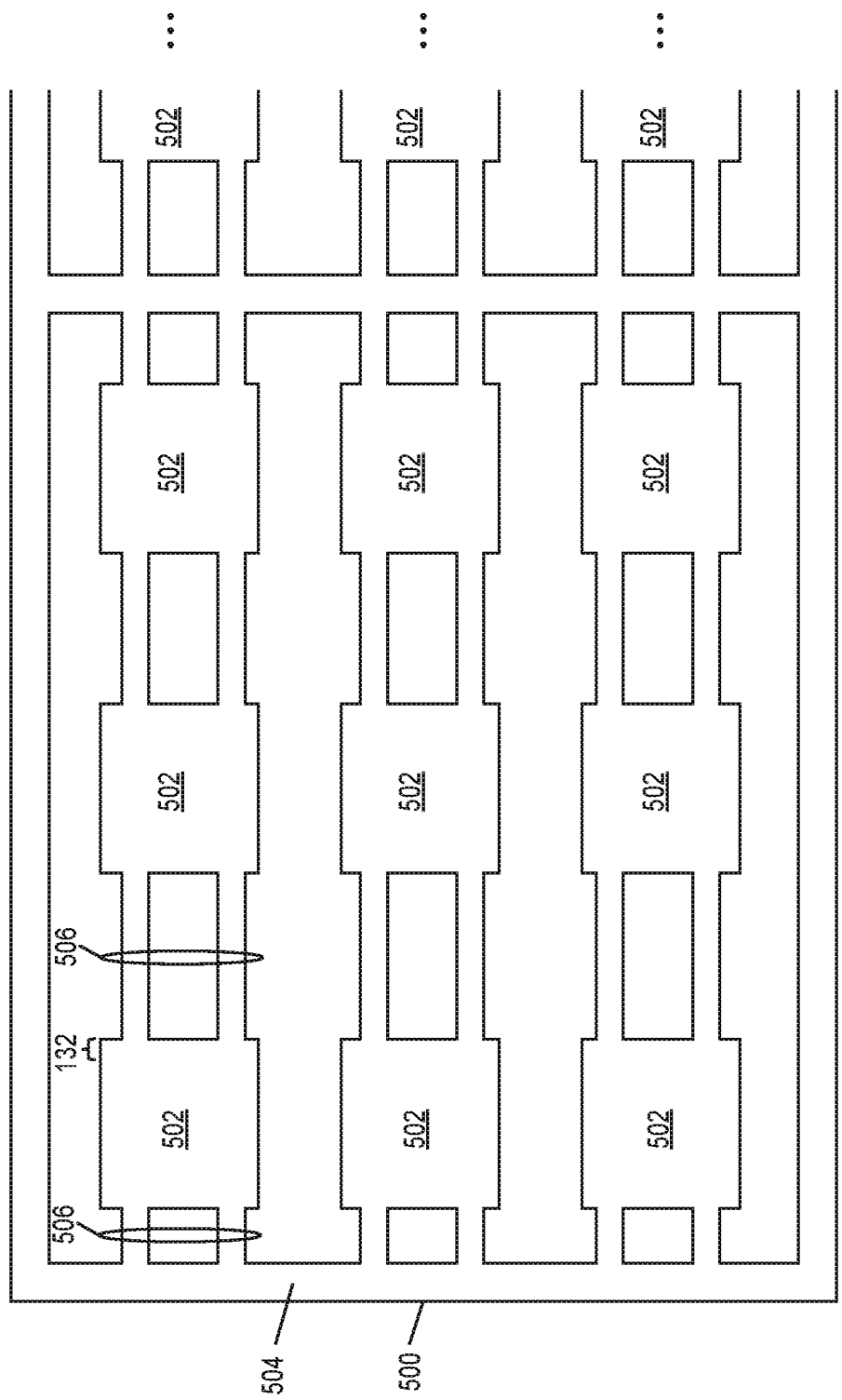

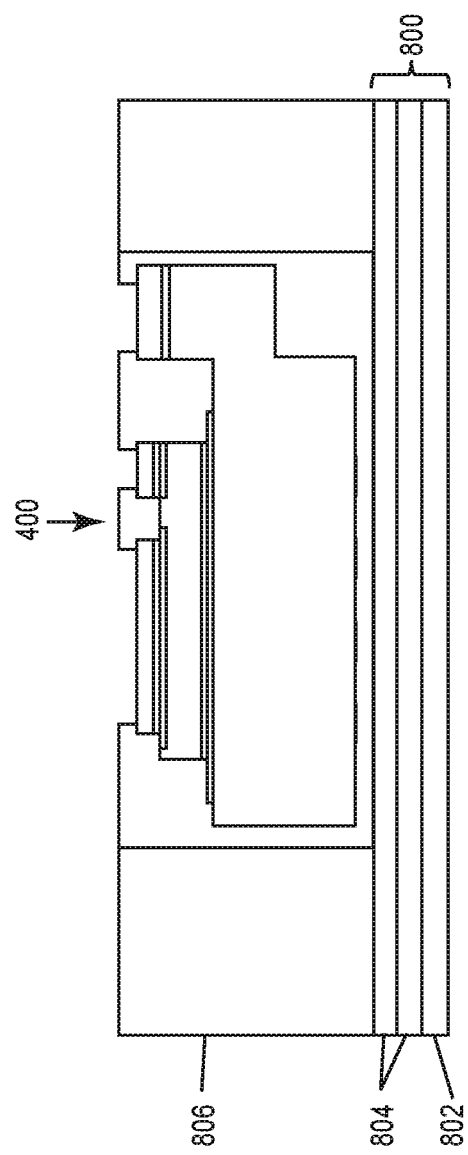

POWER SEMICONDUCTOR MODULE FOR PCB EMBEDDING, POWER ELECTRONIC ASSEMBLY HAVING A POWER MODULE EMBEDDED IN A PCB, AND CORRESPONDING METHODS OF PRODUCTION

BACKGROUND

Power semiconductor modules for embedding in a PCB (printed circuit board) typically include a large metal block with a power semiconductor die attached to the metal block. The metal block and power semiconductor die are embedded in a PCB insulator material such as FR4. Holes are then formed in the insulator material to access electrical contact pads of the power semiconductor die, and the holes are filled with an electrically conductive material such as copper. Additional semiconductor dies and other components such as passives (capacitors, inductors, resistors, etc.) are typically attached to the top side of the PCB.

The process described above suffers from die placement accuracy issues and requires tight control for interfaces that are later connected by vias. Accurate gate pad contacting is particularly problematic, since the gate pad of a power semiconductor die is relatively small compare to the power/load pads. Furthermore, semiconductor material such as silicon is highly sensitive to laser drilling used to form the openings in the PCB insulator material, contamination from the PCB process, and ions present in FR4 and other types of glass-reinforced epoxy laminate materials used in PCB processing.

Accordingly, there is a need for an embedded power semiconductor module that does not suffer from the problems described above and related methods of production.

SUMMARY

According to an embodiment of a method of batch producing power modules, the method comprises: applying a first solder paste to substrate sections of a leadframe structure; placing a plurality of power semiconductor dies on the first solder paste, each power semiconductor die having a first load terminal and a control terminal at a first side that faces away from the leadframe structure and a second load terminal contacting the first solder paste at a second side opposite the first side; applying a second solder paste to the first load terminal and the control terminal of each power semiconductor die; vertically aligning a metal clip frame with the leadframe structure, the metal clip frame comprising a first metal clip vertically aligned with the first load terminal of each power semiconductor die and a second metal clip vertically aligned with the control terminal of each power semiconductor die; pressing the metal clip frame toward the leadframe structure in a pressing direction, wherein a hard stop feature prevents further pressing when the hard stop feature is engaged; reflowing the first solder paste and the second solder paste to form a first soldered joint between each first metal clip and the corresponding first load terminal of each power semiconductor die, a second soldered joint between each second metal clip and the corresponding control terminal of each power semiconductor die, and a third soldered joint between the second load terminal of each power semiconductor die and the corresponding substrate section of the leadframe structure; and severing connections to the leadframe structure and to the metal clip frame, to form individual power modules.

According to an embodiment of a method of producing an electronic assembly, the method comprises: embedding a power module in an electrically insulating body of a printed circuit board, the power module comprising: a leadframe; a power semiconductor die having a first load terminal and a control terminal at a first side of the power semiconductor die and a second load terminal at a second side opposite the first side, the second load terminal being soldered to the leadframe; a first metal clip soldered to the first load terminal and forming a first terminal of the power module at a first side of the power module; and a second metal clip soldered to the control terminal and forming a second terminal of the power module at the first side of the power module, wherein the leadframe extends to the first side of the power module and forms a third terminal of the power module at the first side of the power module, or a third metal clip is soldered to the leadframe and forms the third terminal of the power module; forming a plurality of openings in the electrically insulating body of the printed circuit board that expose the first terminal, the second terminal and the third terminal of the power module at the first side of the power module; and filling the plurality of openings with an electrically conductive material.

According to an embodiment of a power electronic assembly, the power electronic assembly comprises: a printed circuit board (PCB); and a power module embedded in the PCB, wherein the power module comprises: a leadframe; a power semiconductor die having a first load terminal and a control terminal at a first side of the power semiconductor die and a second load terminal at a second side opposite the first side, the second load terminal being soldered to the leadframe; a first metal clip soldered to the first load terminal and forming a first terminal of the power module at a first side of the power module; and a second metal clip soldered to the control terminal and forming a second terminal of the power module at the first side of the power module, wherein the leadframe extends to the first side of the power module and forms a third terminal of the power module at the first side of the power module, or a third metal clip is soldered to the leadframe and forms the third terminal of the power module, wherein the PCB includes electrically conductive vias that extend through one or more insulating layers of the PCB and contact the first terminal, the second terminal and the third terminal of the power module at the first side of the power module.

According to an embodiment of a power module for embedding in a printed circuit board (PCB), the power module comprises: a leadframe; a power semiconductor die having a first load terminal and a control terminal at a first side of the power semiconductor die and a second load terminal at a second side opposite the first side, the second load terminal being soldered to the leadframe; a first metal clip soldered to the first load terminal and forming a first terminal of the power module at a first side of the power module; and a second metal clip soldered to the control terminal and forming a second terminal of the power module at the first side of the power module, wherein the leadframe extends to the first side of the power module and forms a third terminal of the power module at the first side of the power module, or a third metal clip is soldered to the leadframe and forms the third terminal of the power module, wherein the first terminal, the second terminal and the third terminal of the power module are coplanar within +/−30 μm at the first side of the power module.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIGS. 5A through 5E illustrate partial top plan views during different stages of batch producing the power modules shown in FIGS. 1 through 4.

FIGS. 8A through 8G illustrate respective partial cross-sectional views of an embodiment of producing an electronic assembly using any of the power modules shown in FIGS. 1 through 4.

DETAILED DESCRIPTION

The embodiments described herein provide a power semiconductor module for PCB embedding, a power electronic assembly that includes the power module embedded in a PCB, and corresponding methods of production. The power module production process uses solder paste instead of diffusion soldering for attaching a power semiconductor die to a leadframe and for attaching metal clips to terminals at the opposite side of the power semiconductor die as the leadframe, but with improved tolerance control. The metal clips soldered to the terminals of the power semiconductor die at the opposite side as the leadframe form terminals of the power module at the front side of the power module. Improved tolerance control results by using the leadframe or an additional metal clip soldered to the leadframe as an additional terminal of the power module at the front side of the power module.

The power module terminals may be coplanar within +/−30 μm at the front side of the power module. The solder layers on the front and back sides of the power semiconductor die balance the tolerances associated with the solder process and also die warpage. Accordingly, relatively thin dies (e.g., 100 μm thickness or less in the case of Si) with standard front side metallization may be used instead of a diffusion solder process. Diffusion soldering relies on a reaction between a thin layer of molten solder and metal on the components to form one or more intermetallic phases that are solid at the joining temperature. The resulting diffusion soldered joint will not remelt unless heated to a higher temperature at which one of the intermetallic phases melts. The embodiments described herein yield a power semiconductor module with similar tolerances provided by diffusion solder-based processes but without the added complexity, while not requiring the use of a thick front side metallization (e.g., 10 μm thick Cu). Also, standard solder processes are 100° C. lower than diffusion soldering, thus avoiding bimetallic bending of the die-to-metallization (e.g., Cu) interface.

Described next, with reference to the figures, are exemplary embodiments of the power semiconductor module for PCB embedding, a power electronic assembly that includes the power module embedded in a PCB, and corresponding methods of production.

Figure 1:
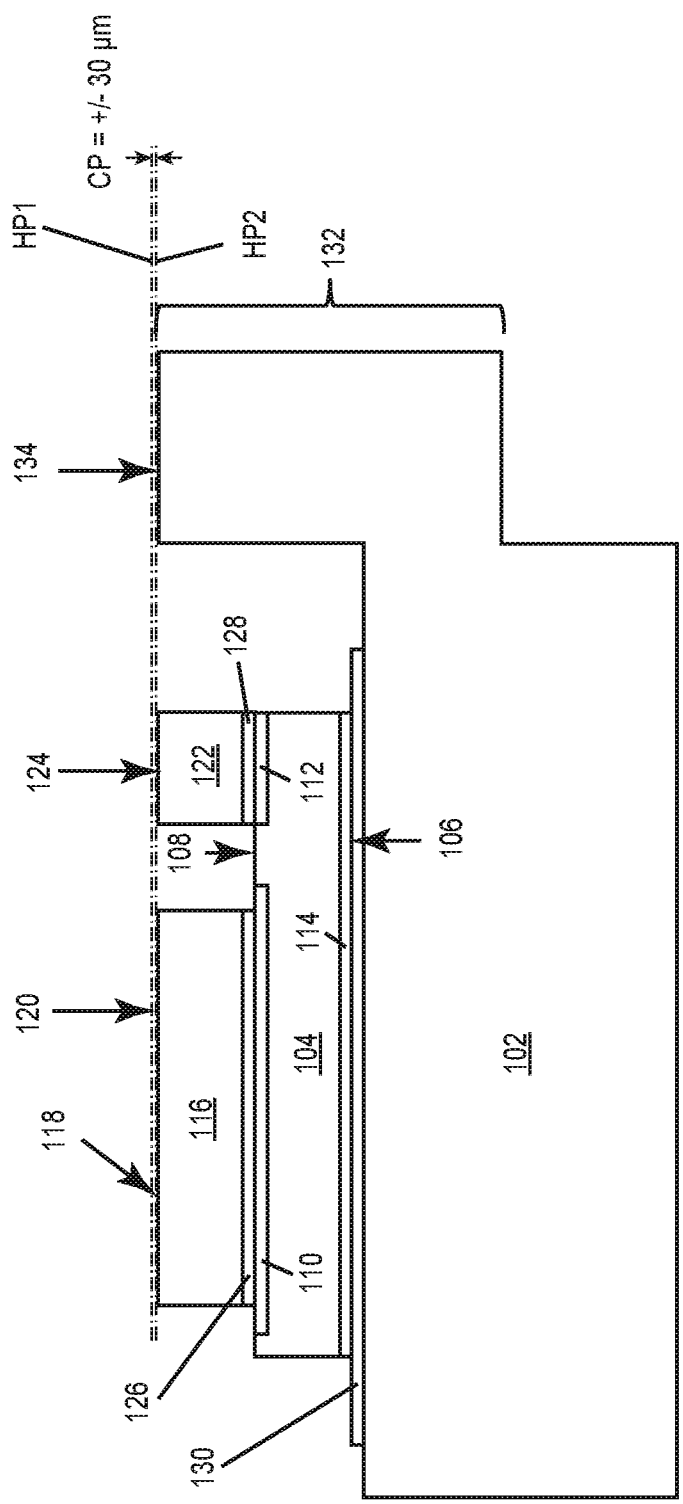
FIGS. 1 through 4 illustrate respective cross-sectional views of power modules for embedding in a printed circuit board (PCB), according to different embodiments.

FIG. 1 illustrate a cross-sectional view of a power module 100 for embedding in a printed circuit board (PCB). In one embodiment, the power module 100 has a rated voltage in a range of 600V to 1200V. The power module 100 may instead have a lower (<600V) rated voltage or a higher (>1200V) rated voltage.

The power module 100 includes at least one leadframe 102 and at least one power semiconductor die 104 attached to the leadframe 102. The leadframe 102 may be made of copper (Cu), nickel (Ni), nickel phosphorous (NiP), silver (Ag), palladium (Pd), gold (Au), etc., alloys or combinations thereof, or any other electrically conductive material suitable for leadframe applications. The power semiconductor die 104 may comprise any type of semiconductor material such as Si, SiC, GaN, etc. and have a rated voltage in a range of 600V to 1200V. The power semiconductor die 104 may instead have a lower (<600V) rated voltage or a higher (>1200V) rated voltage.

FIG. 1 illustrates the power semiconductor die 104 as a vertical power device. In the case of a vertical power device, some load and possibly signal connections to the power semiconductor die 104 are made at the back side 106 of the die 104 which is attached to the leadframe 102. For example, in the case of a vertical power MOSFET (metal-oxide-semiconductor field-effect transistor) or vertical IGBT (insulated gate bipolar transistor), source/emitter and gate connections may be made at the front side 108 of the power semiconductor die 104 and a drain/collector connection may be made at the back side 106 of the die 104.

More generally, and in the case of a vertical power transistor, the power semiconductor die 104 has a first load terminal 110 and a control terminal 112 at the front side 108 of the die 104 and a second load terminal 114 at the back side 106 of the die 104. For a vertical power MOSFET, the first load terminal 110 may be a source terminal, the second load terminal 114 may be a drain terminal, and the control terminal 112 may be a gate terminal. For a vertical IGBT, the first load terminal 110 may be an emitter terminal, the second load terminal 114 may be a collector terminal, and the control terminal 112 may be a gate terminal. Depending on how the gate connections are routed, the first load terminal 110 may be implemented as a contiguous (uninterrupted) metal pad or as a segmented metal pad having two or more spaced apart sections. The second load terminal 114 at the back side 106 of the power semiconductor die 104 similarly may be implemented as a contiguous metal pad or as a segmented metal pad, e.g., to account for CTE (coefficient of thermal expansion) mismatch.

In each case, the second load terminal 114 of the power semiconductor die 104 is soldered to the leadframe 102. At the opposite (front) side 108 of the power semiconductor die 104, a first metal clip 116 is soldered to the first load terminal 110 of the die 104 and forms a first terminal 118 of the power module 100 at the front side 120 of the power module 100. A second metal clip 122 is soldered to the control terminal 112 of the power semiconductor die 104 and forms a second terminal 124 of the power module 100 at the first side 122 of the power module 100.

The first metal clip 116 is soldered to the first load terminal 110 of the power semiconductor die 104 via a first soldered joint 126, the second metal clip 122 is soldered to the control terminal 112 of the die 104 via a second soldered joint 128, and the second load terminal 114 of the die 104 is soldered to the leadframe 102 via a third soldered joint 130.

The soldered joints 126, 128, 130 are each formed from a solder paste. Hence, the soldered joints 126, 128, 130 are not diffusion soldered joints. That is, the soldered joints 126, 128, 130 are not formed by a diffusion soldering process that involves reacting a thin layer of molten solder with metal of the leadframe 102 and die terminals 110, 112 to form one or more intermetallic phases that becomes solid at the joining temperature. Instead, solder paste is used to form the soldered joints 126, 128, 130 between the terminals 110, 112, 114 of the power semiconductor die 104 and the metal clips 116, 122 and leadframe 102, respectively.

Further according to the embodiment illustrated in FIG. 1, a section 132 of the leadframe 102 extends to the first side 120 of the power module 100 and forms a third terminal 134 of the power module 100 at the first side 120 of the module 100. The leadframe 102 may be coined, stamped, etched, etc. to yield the dual-gauge (dual-thickness) configuration shown in FIG. 1 and according to which the extended section 132 of the leadframe 102 forms a terminal 134 of the power module 100.

The first terminal 118, the second terminal 124 and the third terminal 134 of the power module 100 provide respective points of external electrical contact for the power module 100 and are coplanar within +/−30 μm at the first side 120 of the power module 100 as indicated by 'CP' in FIG. 1. That is, the first terminal 118, the second terminal 124 and the third terminal 134 of the power module 100 may lie in the same horizontal plane (e.g., HP1 or HP2 in FIG. 1) relative to the first side 120 of the power module 100 or may lie in different horizontal planes (e.g., HP1 and HP2 in FIG. 1) with a vertical offset of no more than +/−30 μm between the horizontal planes.

The soldered joints 126, 128, 130 at the back and front sides 106, 108 of the power semiconductor die 104 balance the tolerances associated with the solder process and also die warpage, enabling a module terminal coplanarity of +/−30 μm at the first side 120 of the power module 100. Accordingly, relatively thin dies (e.g., 100 μm thickness or less) with solderable front side metallization (e.g., 5 μm thick Cu, Ni, AlCu, AlSiCu, etc.) may be used to realize the first load terminal 110 and the control terminal 112 at the front side 108 of the power semiconductor die 104. Solderable back side metallization (e.g., NiAg, NiV, etc.) may be used to realize the second load terminal 114 at the back side 106 of the power semiconductor die 104. Accordingly, a thicker front side metallization (e.g., 10 μm thick Cu) is not required. For example, the first load terminal 110, the second load terminal 114 and the control terminal 112 of the power semiconductor die 104 may comprise Cu and have a thickness less than 10 μm.

The power module 100 will be subsequently embedded in a PCB laminate material such as FR4. Conductive vias to the power module terminals 118, 124, 134 will be formed by laser drilling through the PCB laminate material and subsequent via filling or lining with Cu. Via length is a critical parameter of the OPCB embedding process. A poorly controlled module terminal coplanarity (outside +/−30 μm) results in overly long or overly short vias. Typically, a via aspect ratio (vertical height to horizontal width) of 1 is preferred. If a via is too tall, the risk of an incomplete via increases. That is, some PCB laminate material may remain in the via and the corresponding electrical connection is not formed. If a via is too wide, the risk of a partially filled via increases. That is, the via may not be adequately filled or lined with Cu and the corresponding electrical connection is insufficient or incomplete. Via length is a function of the power module terminal coplanarity. A terminal coplanarity of +/−30 μm at the first side 120 of the power module 100 ensures proper formation of the vias during the PCB embedding process.

One or more additional metal clips (not shown) may be attached to corresponding terminal(s) at the front side 108 of the power semiconductor die 104, e.g., in case the power semiconductor die 104 includes more than the first load terminal 110 and the control terminal 112 at the front side 108 of the die 104. For example, the power semiconductor die 104 may include one or more sense terminals (not shown) such as a current sense and/or temperature sense terminal at the front side 108 of the power semiconductor die 104. In these cases, each additional metal clip attached to a corresponding terminal at the front side 108 of the power semiconductor die 104 forms a terminal of the power module 100 and is coplanar with the other power module terminals 118, 124, 134 within +/−30 μm at the first side 120 of the power module 100.

Figure 2:
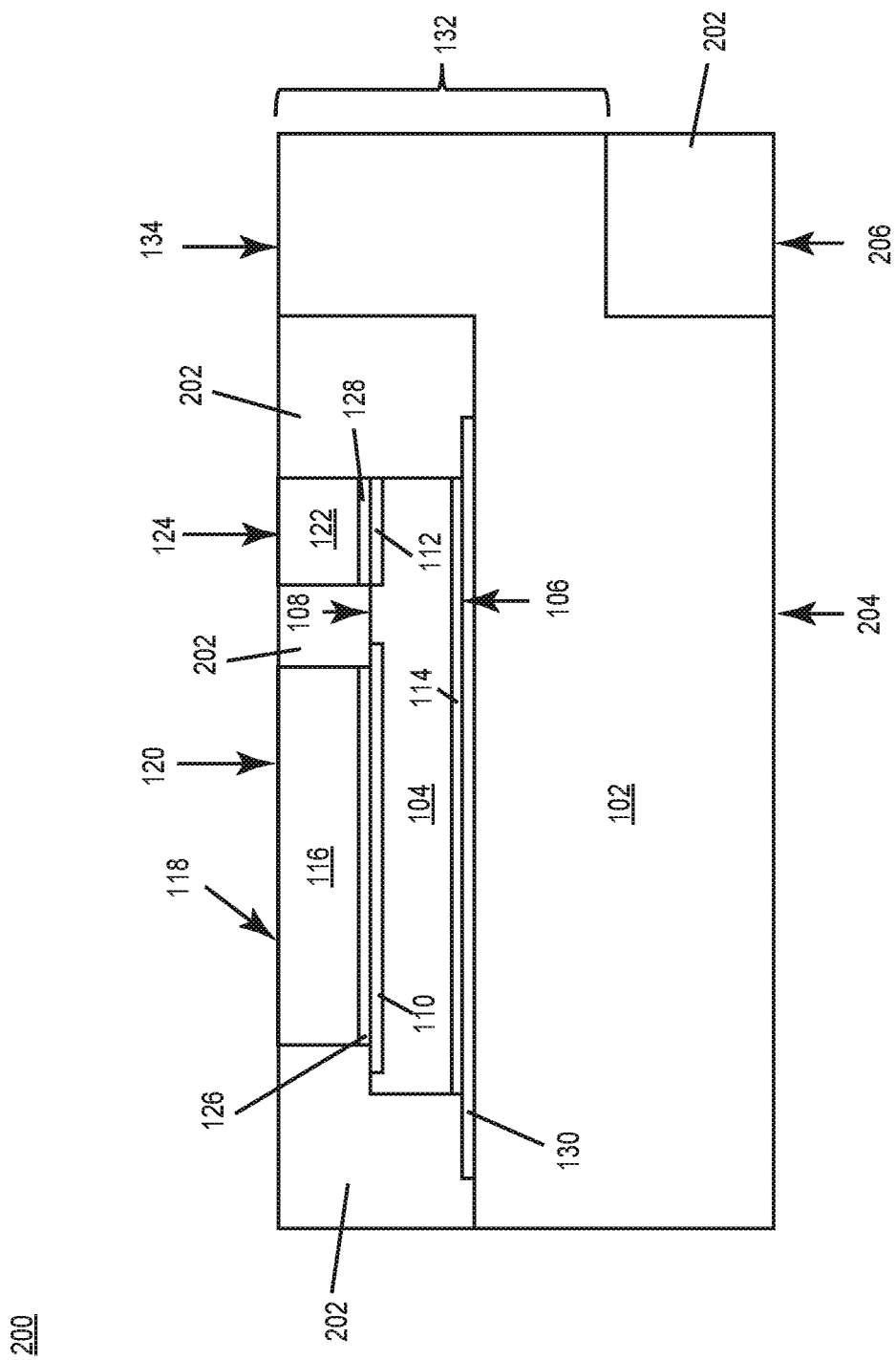

FIG. 2 illustrate a cross-sectional view of another embodiment of a power module 200 for embedding in a PCB. The embodiment shown in FIG. 2 is similar to the embodiment shown in FIG. 1. Different, however, the power module 200 of FIG. 2 is a molded power module. That is, the power semiconductor die 104 and part of the leadframe 102 are embedded in a molding compound 202. The molding compound 202 may be formed by a molding process such as injection molding, compression molding, transfer molding, etc. The terminals 118, 124, 134 of the power module 200 are exposed from the molding compound 202 and therefore accessible for external connection. The back side 204 of the leadframe 102 also may be exposed from the molding compound 202 to enhance heat dissipation at the back side 206 of the power module 200.

Figure 3:
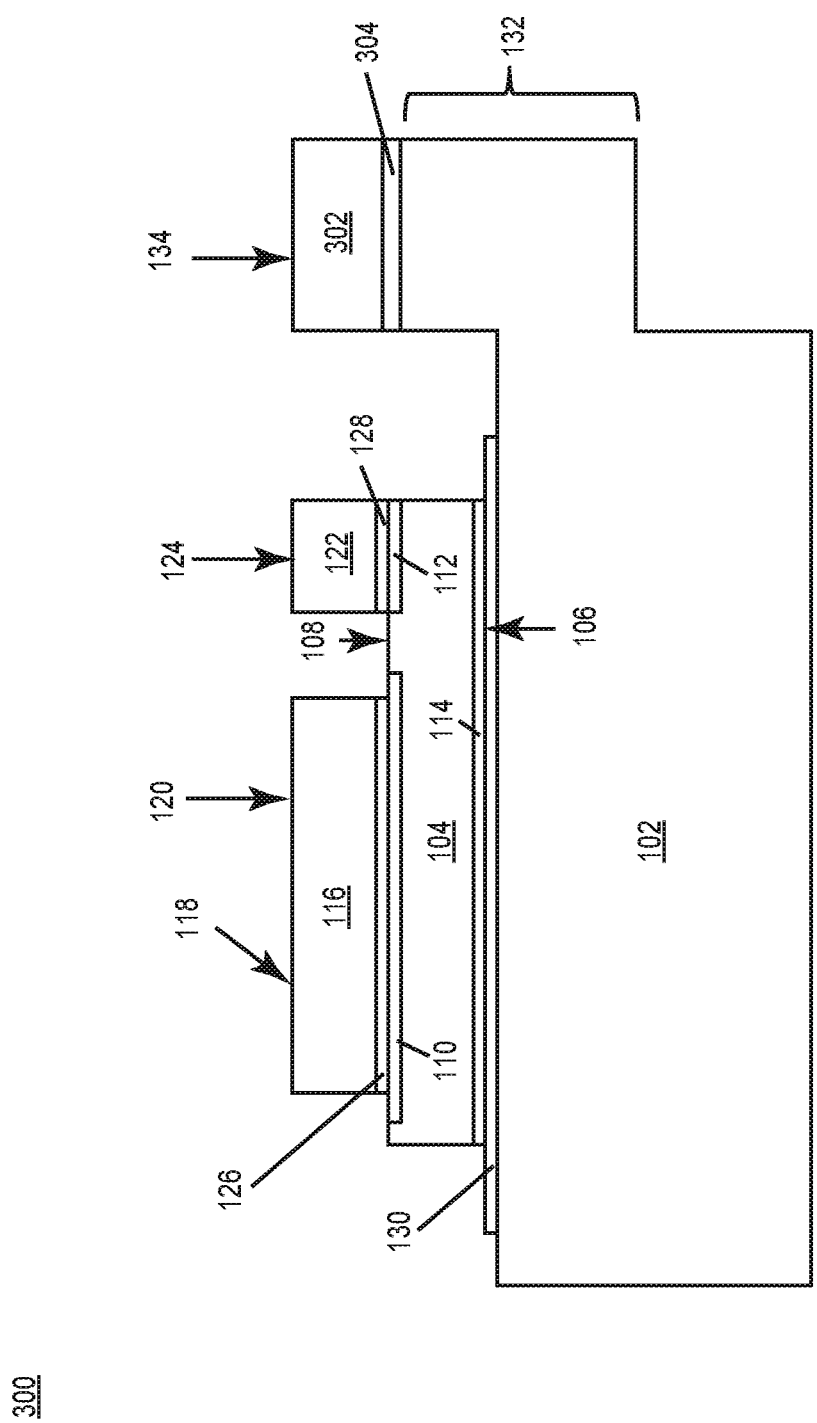

FIG. 3 illustrate a cross-sectional view of another embodiment of a power module 300 for embedding in a PCB. The embodiment shown in FIG. 3 is similar to the embodiment shown in FIG. 1. Different, however, a third metal clip 302 is soldered to the leadframe 102 and forms the third terminal 134 of the power module 300. For example, the third metal clip 302 may be soldered to the extended section 132 of the leadframe 102. More generally, the third metal clip 302 is soldered to the leadframe 102 via a corresponding soldered joint 304. The soldered joint 304 is formed from a solder paste and therefore is not a diffusion soldered joint. As with the embodiments illustrated in FIGS. 1 and 2, the terminals 118, 124, 134 of the power module 300 shown in FIG. 3 are coplanar within +/−30 μm at the first side 124 of the power module 300.

Figure 4:
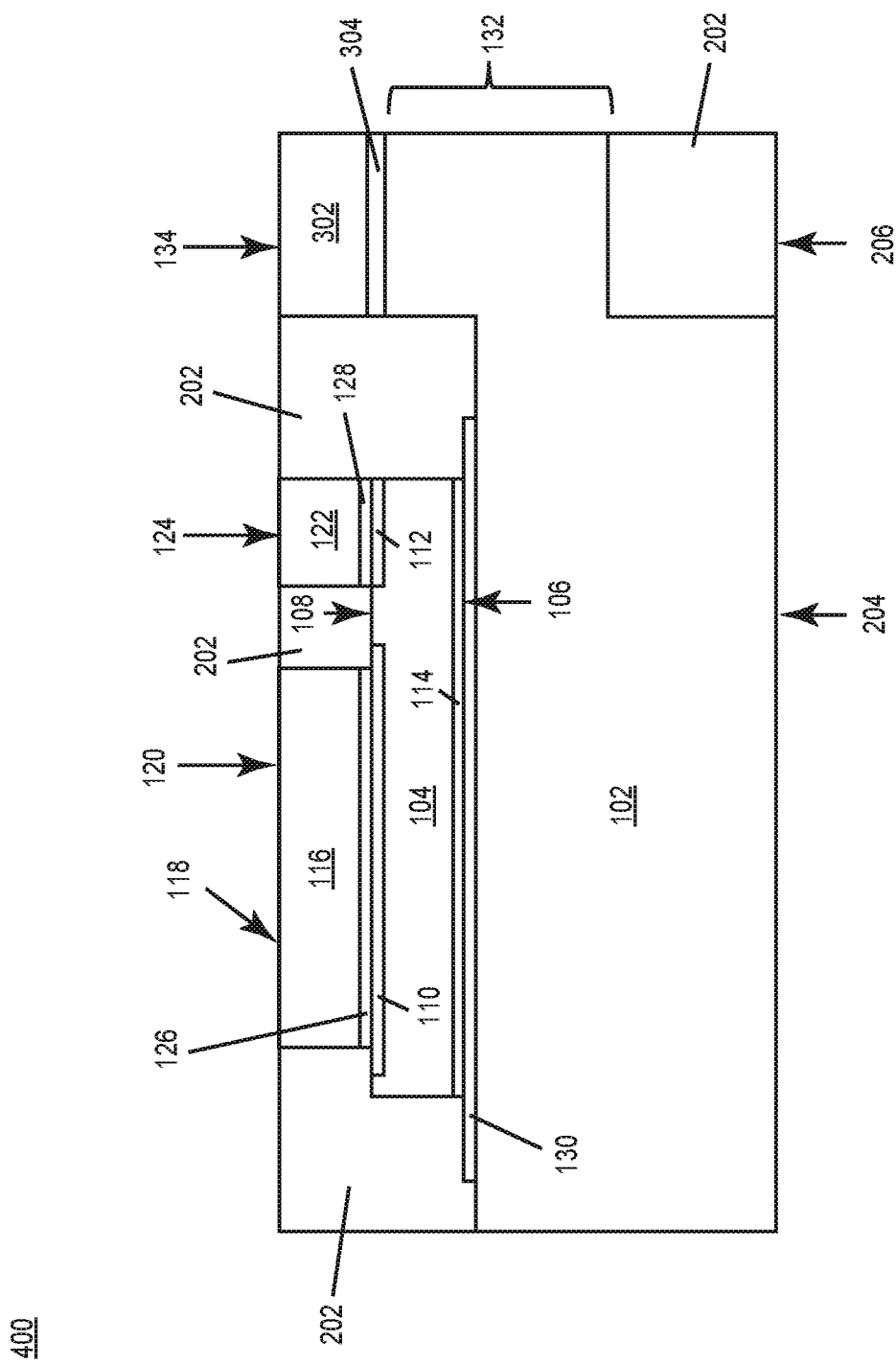

FIG. 4 illustrate a cross-sectional view of another embodiment of a power module 400 for embedding in a PCB. The embodiment shown in FIG. 4 is similar to the embodiment shown in FIG. 3. Different, however, the power module 400 of FIG. 4 is a molded power module. Similar to FIG. 2, the power semiconductor die 104 and part of the leadframe 102 are embedded in a molding compound 202. The terminals 118, 124, 134 of the power module 200 are exposed from the molding compound 202 and therefore accessible for external connection. The back side 204 of the leadframe 102 also may be exposed from the molding compound 202 to enhance heat dissipation at the back side 206 of the power module 200.

FIGS. 5A through 5E illustrate partial top plan views during different stages of batch producing power modules, e.g., of the kinds shown in FIGS. 1 through 4.

FIG. 5A shows a leadframe structure 500 such as a leadframe strip or sheet formed from an electrically conductive material such as Cu, Ni, NiP, Ag, Pd, Au, etc., alloys or combinations thereof, or any other electrically conductive material suitable for leadframe applications. According to one technique, the leadframe structure 500 is provided by a sheet of metal and the various features of the leadframe structure 500 are formed by performing techniques such as stamping, punching, etching, bending, coining, etc. to form substrate sections 502 which are temporarily secured to the periphery 504 of the leadframe structure 500 and/or to adjacent substrate sections 502 by connecting structures 506 such as tie bars. The substrate sections 502 are subsequently separated from one another and from the periphery 504 of the leadframe structure 500 by severing the connecting structures 506. The leadframes 102 shown in FIGS. 1 through 4 may correspond to any of the substrate sections 502 of the leadframe structure 500. For example, an extended leadframe section 132 is identified in FIG. 5A for one of the substrate sections 502.

Figure 5B:
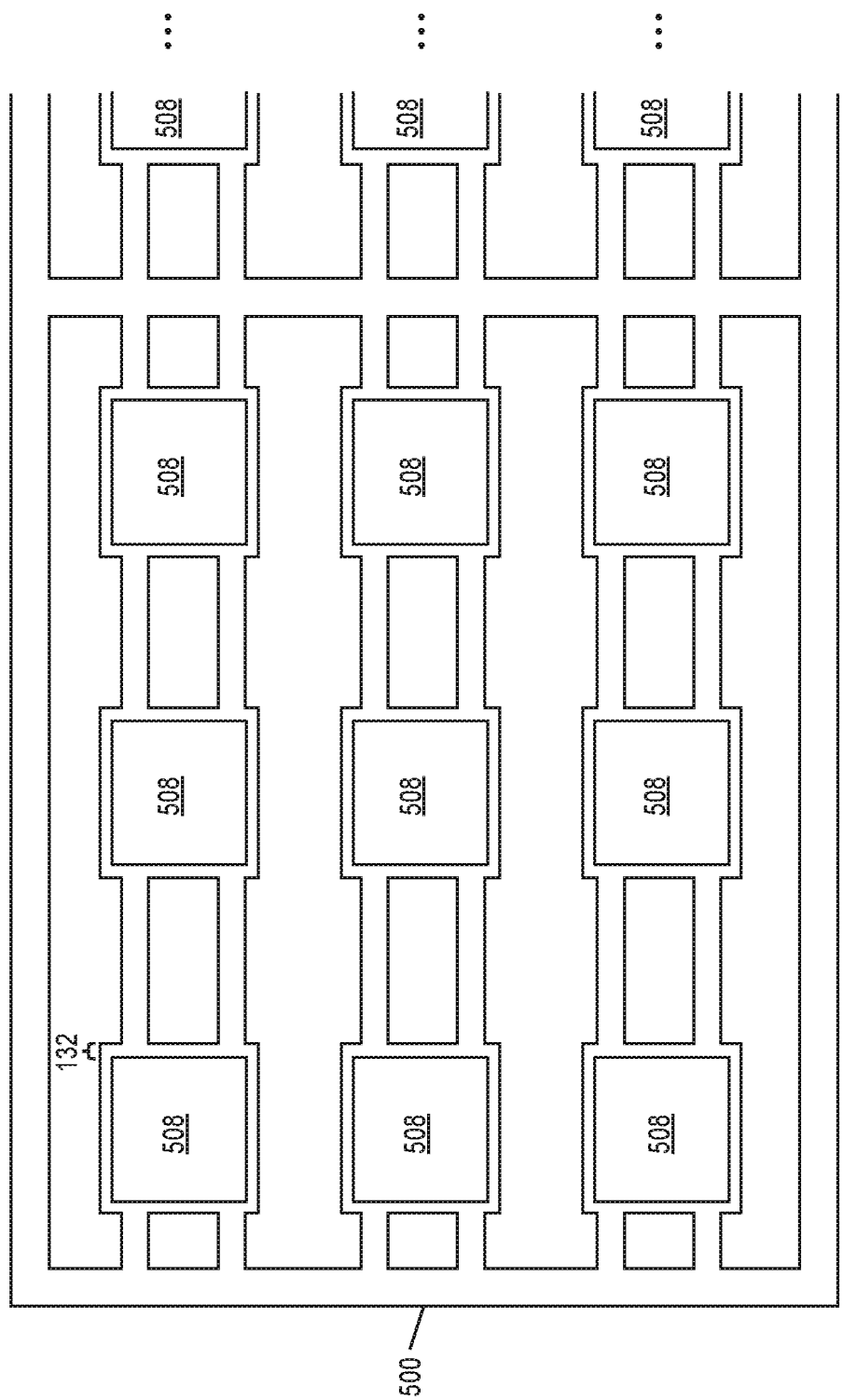

FIG. 5B shows a first solder paste 508 applied to the substrate sections 502 of the leadframe structure 500. The first solder paste 508 may be applied to the substrate sections 502 using a printing process such as stencil or screen printing or a dispensing or jetting process, etc.

Figure 5C:
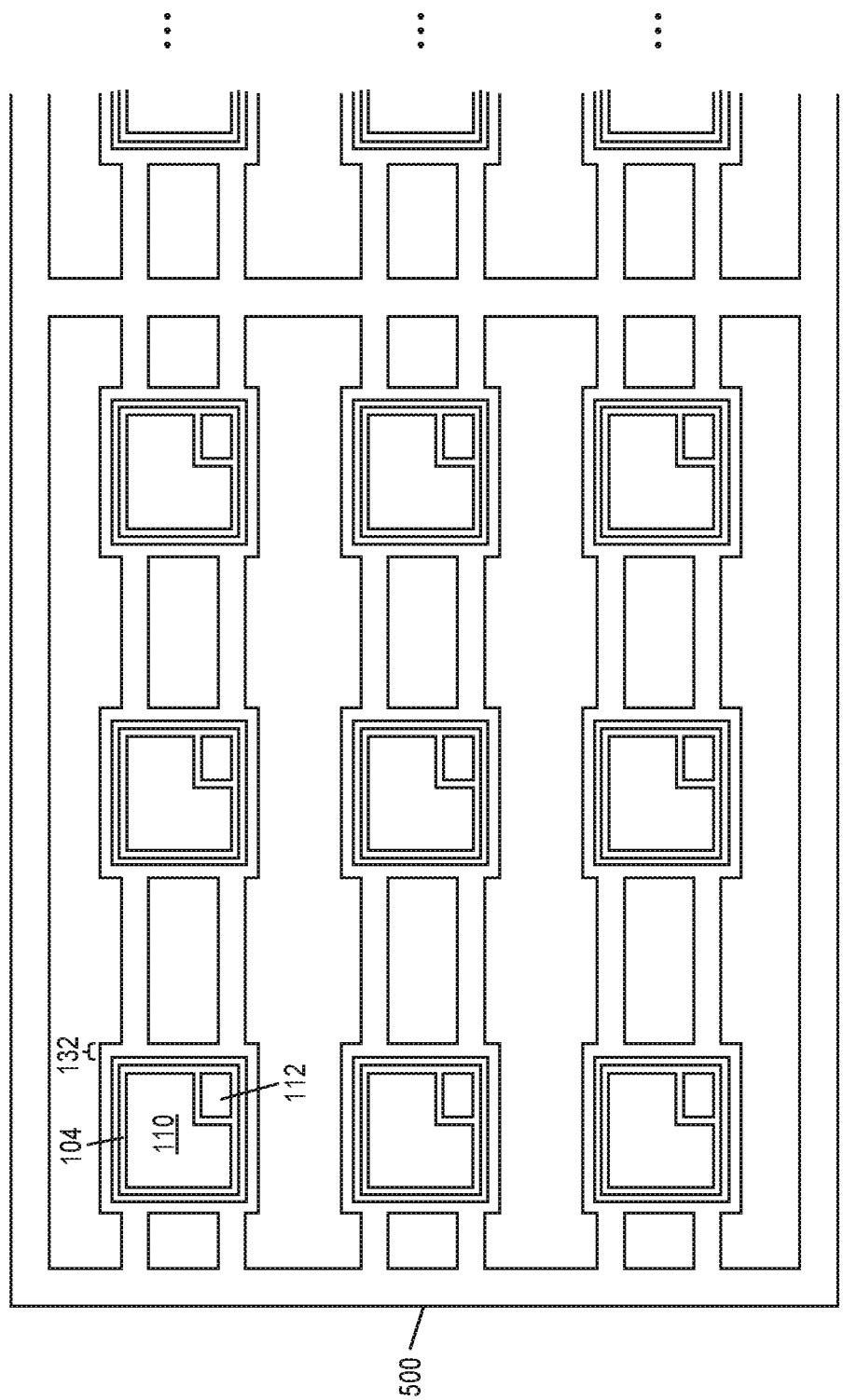

FIG. 5C shows a power semiconductor die 104 placed on the first solder paste 508 applied to the substrate sections 502 of the leadframe structure 500. Each power semiconductor die 104 has a first load terminal 110 and a control terminal 112 at a first side that faces away from the leadframe structure 500 and a second load terminal (out of view; terminal 114 in FIGS. 1 through 4) contacting the first solder paste 508 at a second side opposite the first side. The first load terminal 110 of each power semiconductor die 104 may be a contiguous metal pad as shown in FIG. 5C or a segmented metal pad having two or more spaced apart sections. The second load terminal at the opposite side of each power semiconductor die also may be implemented as a contiguous metal pad or as a segmented metal pad, e.g., as previously described herein. In one embodiment, each power semiconductor die 104 has a thickness less than 100 µm and the first load terminal 110, the second load terminal 114 and the control terminal 112 of each power semiconductor die 104 comprise Cu and have a thickness less than 10 µm.

Figure 5D:
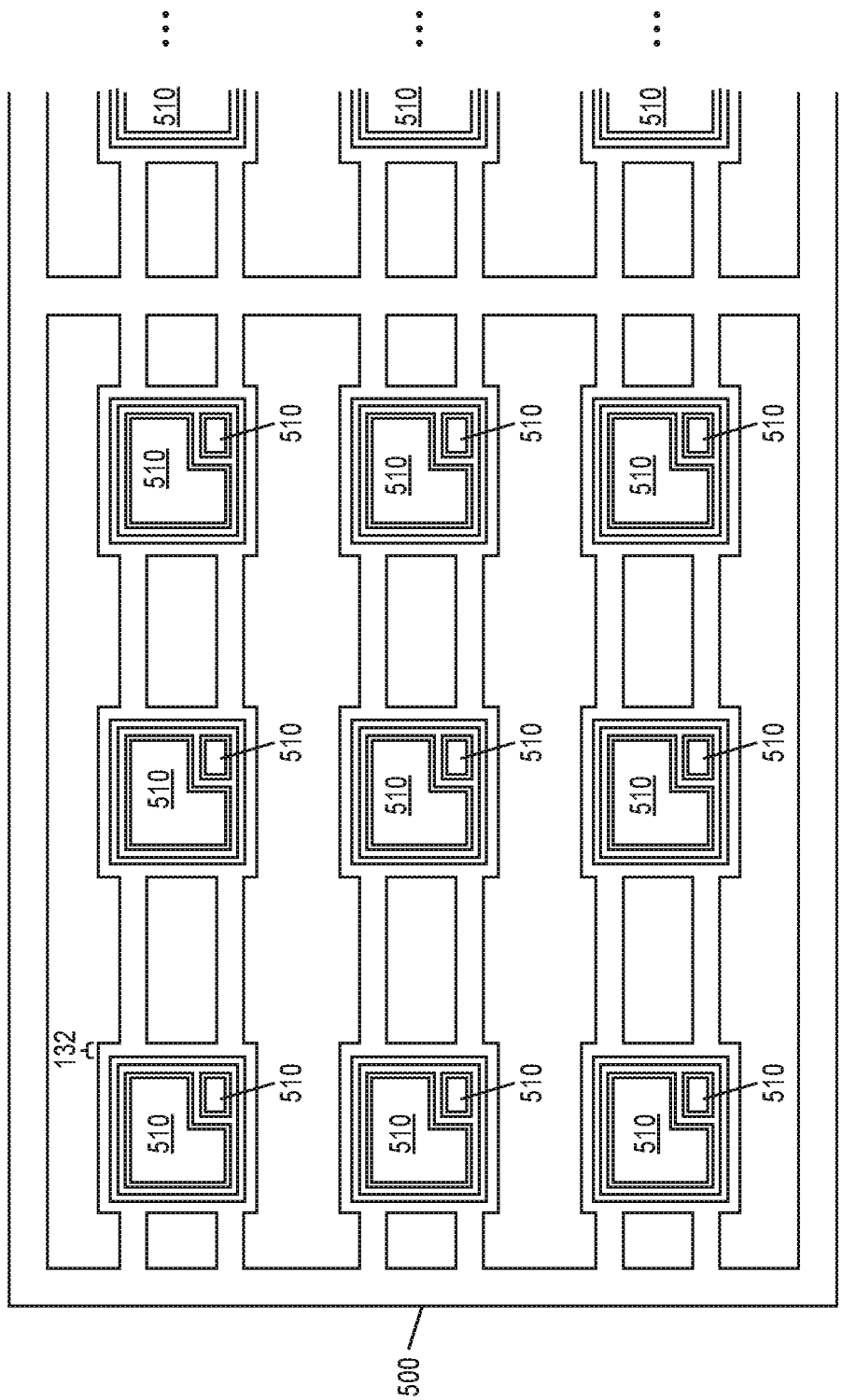

FIG. 5D shows a second solder paste 510 applied to the first load terminal 110 and the control terminal 112 of each power semiconductor die 104. The second solder paste 510 may be applied to the die terminals 110, 112 using a printing process such as stencil or screen printing or a dispensing or jetting process, etc.

Figure 5E:
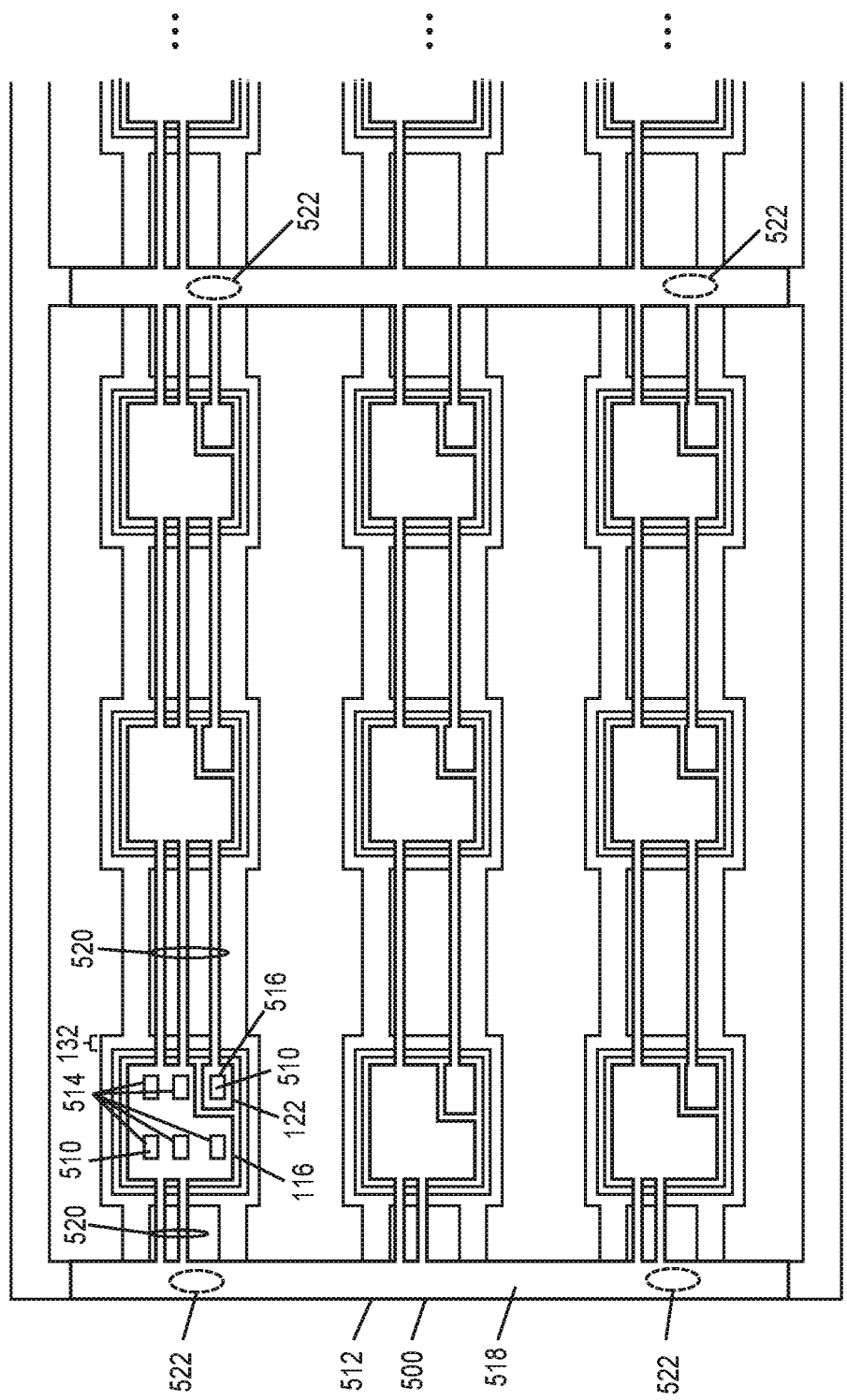

FIG. 5E shows a metal clip frame 512 vertically aligned with the leadframe structure 500. The metal clip frame 512 includes a first metal clip 116 vertically aligned with the first load terminal 110 of each power semiconductor die 104 and a second metal clip 122 vertically aligned with the control terminal 112 of each power semiconductor die 104. The first and second metal clips 116, 122 shown in FIG. 5E correspond to the first and second metal clips 116, 122 shown in FIGS. 1 through 4.

In one embodiment, each first metal clip 116 has a plurality of slots 514 configured as a reservoir for accommodating the second solder paste 510 used to solder the first metal clip 116 to the first load terminal 110 of the corresponding power semiconductor die 104. Similarly, each second metal clip 112 may have one or more slots 516 configured as a reservoir for accommodating the second solder paste 510 used to solder the second metal clip 122 to the control terminal 112 of the corresponding power semiconductor die 104.

The metal clips 116, 122 are temporarily secured to the periphery 518 of the metal clip frame 512 and/or to adjacent metal clips 116/122 by connecting structures 520 such as tie bars. The metal clip frame 512 is pressed toward the leadframe structure 500 in a pressing direction which is perpendicular to the view provided in FIG. 5E. A hard stop feature 522 prevents further pressing when the hard stop feature 522 is engaged. The hard stop feature 522 is out of view in FIG. 5E and therefore illustrated by dashed ovals. The hard stop feature 522 may be part of the metal clip frame 512, part of the leadframe structure 500, partly formed on the metal clip frame 512 and partly formed on the leadframe structure 500, or a separate component interposed between the metal clip frame 512 and the leadframe structure 500.

The first solder paste 508 and the second solder paste 510 are then reflowed to form the first soldered joint 126 between each first metal clip 116 and the corresponding first load terminal 110 of each power semiconductor die 104, the second soldered joint 128 between each second metal clip 122 and the corresponding control terminal 112 of each power semiconductor die 104, and the third soldered joint 130 between the second load terminal 114 of each power semiconductor die 104 and the corresponding substrate section 502 of the leadframe structure 500.

The connections 506, 520 to the leadframe structure 500 and to the metal clip frame 512 are then severed to form individual power modules, e.g., of the kind illustrated in any of FIGS. 1 through 4. The connections 506, 520 may be severed by stamping, punching, laser cutting, saw blade cutting, etching, etc. Prior to severing the connections 506, 520 to the leadframe structure 500 and to the metal clip frame 512, the power modules may be molded to yield molded power modules, e.g., as shown in FIGS. 2 and 4.

The hard stop feature 522 may be used to determine the bond line thickness for each first soldered joint 126, each second soldered joint 128, and each third soldered joint 130 and thus helps to ensure a terminal coplanarity of +/−30 µm at the first side of each power module. The hard stop feature 522 may include a plurality of protrusions at a side of the metal clip frame 512 that faces the leadframe structure 500 when the metal clip frame 512 is vertically aligned with the leadframe structure 500. Separately or in combination, the hard stop feature 522 may include a plurality of protrusions at a side of the leadframe structure 500 that faces the metal clip frame 512 when the metal clip frame 512 is vertically aligned with the leadframe structure 500. Separately or in combination, the hard stop feature 522 may include a plurality of tabs, bumps or similar structures that protrude downward from the periphery 518 of the metal clip frame 512 in a direction toward the leadframe structure 500 when the metal clip frame 512 is vertically aligned with the leadframe structure 500. Separately or in combination, the hard stop feature 522 may be designed to limit movement of the metal clip frame 512 in at least one lateral direction (x and/or y direction in FIG. 5E) that is orthogonal to the pressing direction, when the metal clip frame 512 is pressed onto the leadframe structure 500. For example, the hard stop feature 522 may be designed as a locking mechanism such as a protrusion, tab, bump, etc. formed on the metal clip frame 512 or leadframe structure 500 and a correspondingly mated recess on the other structure 504/512 that prevents movement in the x and/or y direction when the metal clip frame 512 is pressed onto the leadframe structure 500.

Figure 6:
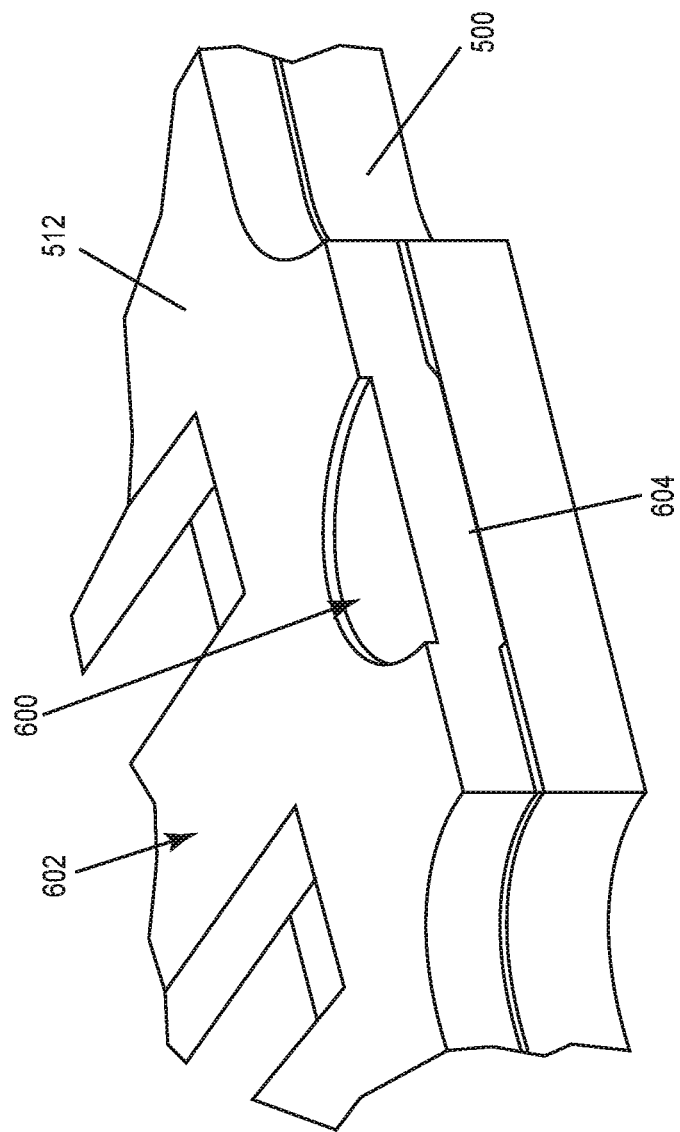
FIG. 6 illustrates a partial side perspective view of an embodiment of a hard stop feature using during the batch production process.

FIG. 6 illustrates an embodiment of the hard stop feature 522. FIG. 6 shows part of the metal clip frame 512 vertically aligned with and pressed onto the leadframe structure 500. According to this embodiment, the metal clip frame 512 has been punched, stamped, coined, etc. to form a recess or dimple 600 at the side 602 of the metal clip frame 512 facing away from the leadframe structure 500. A corresponding protrusion 604 extends from the opposite side of the metal clip frame 512 in the region of the recess/dimple 600. Implementing the hard stop feature 522 as a protrusion 604 at the side of the metal clip frame 512 facing the leadframe structure 500 prevents further pressing of the metal clip frame 512 towards the leadframe structure 500 once the protrusion 604 engages the leadframe structure 500.

The leadframe structure 500 instead may include the protrusion 604, or both the metal clip frame 512 and the leadframe structure 500 may include the protrusion 604. More than one protrusion 604 may be formed on the metal clip frame 512 and/or the leadframe structure 500, and the protrusion 604 may have any dimensions and shape suitable for functioning as a hard stop against further oppressing of the metal clip frame 512 towards the leadframe structure 500 once engaged. A mating structure, e.g., such as a recess may be formed in the opposite metal structure 500/512 and dimensioned to receive the protrusion to limit movement of the metal clip frame 512 in at least one lateral direction that is orthogonal to the pressing direction when the metal clip frame 512 is pressed onto the leadframe structure 500.

Figure 7:
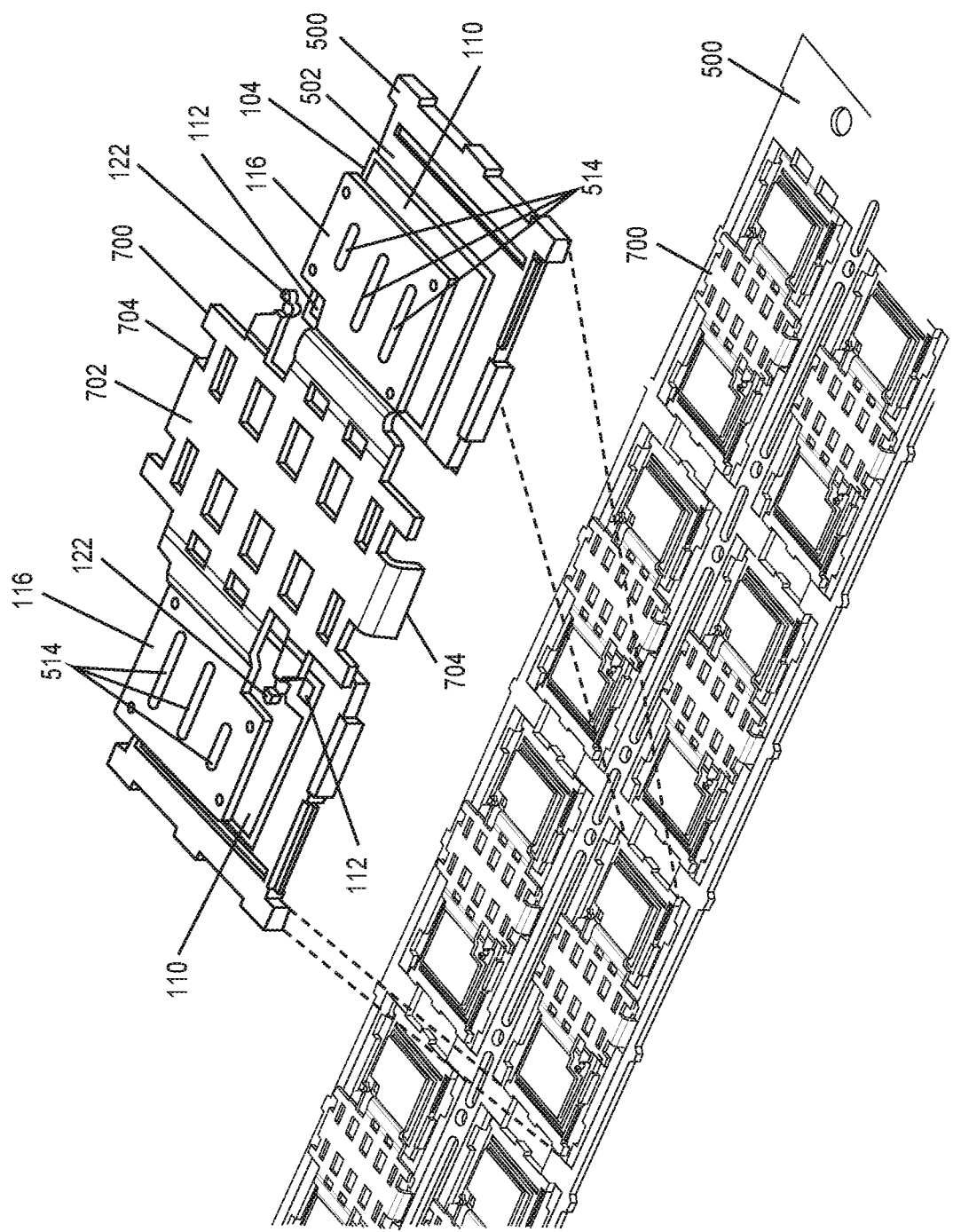
FIG. 7 illustrates a side perspective view and corresponding enlarged view of another embodiment of a hard stop feature using during the batch production process.

FIG. 7 illustrates another embodiment of the hard stop feature 522. FIG. 7 shows the metal clip frame 512 vertically aligned with the leadframe structure 500 and a corresponding enlarged view. According to this embodiment, the metal clip frame 512 is implemented as separate dual-clip frames 700. Each dual-clip frame 700 includes two pairs of first and second metal clips 116, 122 connected by a bridging region 702 that is removed by cutting, etching, stamping, etc. after all soldered joints 126, 128, 130 are formed. Each dual-clip frame 700 is aligned with an adjacent pair of power semiconductor dies 104 attached to the leadframe structure 500, with one pair of the first and second metal clips 116, 122 aligned with the first load terminal 110 and control terminal 112, respectively, of one power semiconductor die 104 and the other pair of the first and second metal clips 116, 122 aligned with the first load terminal 110 and control terminal 112, respectively, of the adjacent power semiconductor die 104.

Further according to the embodiment in FIG. 7, a pair of tabs or protrusions 704 on each dual-clip frame 700 that are bent downward in a direction towards the leadframe structure 500 enable the hard stop function. During vertical alignment and pressing of the dual-clip frames 700 onto the leadframe structure 500, the tabs/protrusions 704 engage the leadframe structure 500 and prevent further pressing of the dual-clip frames 700. The leadframe structure 500 instead may include the tabs/protrusions 704, or both the dual-clip frames 700 and the leadframe structure 500 may include the tabs/protrusions 704.

FIGS. 8A through 8G illustrate respective partial cross-sectional views of an embodiment of producing an electronic assembly using the power modules described herein. The illustrated PCB embedding process uses the molded power module 400 shown in FIG. 4. However, any of the power modules described herein may be used instead.

Figure 8A:
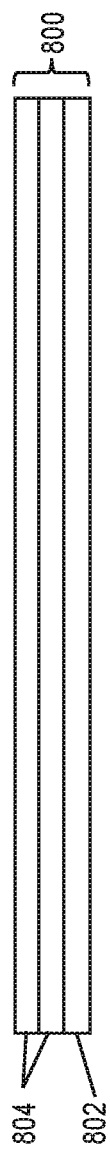

FIG. 8A shows a first PCB laminate 800 that includes a Cu foil 802 and one or more layers of prepreg (pre-impregnated) material 804. Each prepreg layer 804 comprises a PCB dielectric such as FR4.

Figure 8B:
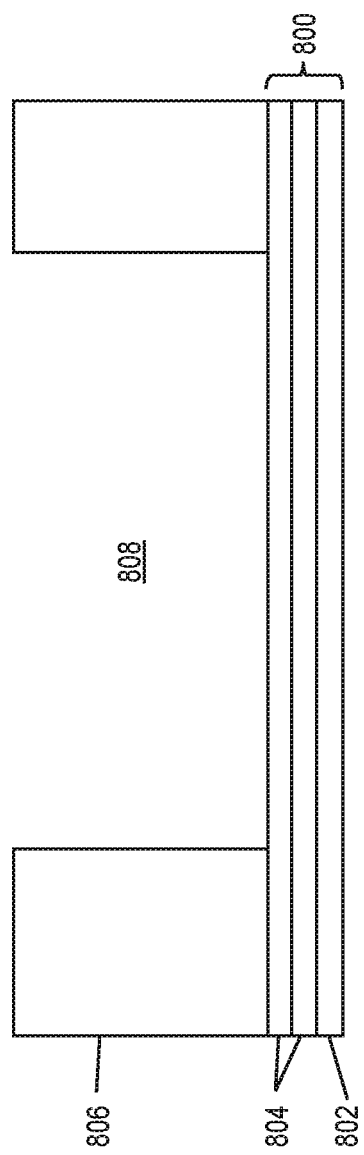

FIG. 8B shows another prepreg layer 806 on the first PCB laminate 800 and having an opening 808 for receiving the molded power module 400. The additional prepreg layer 806 comprises a PCB dielectric such as FR4.

FIG. 8C shows the molded power module 400 seated in the opening 808 of the additional prepreg layer 806. The molded power module 400 may be seated in the opening 808 of the additional prepreg layer 806 after being tested.

Figure 8D:
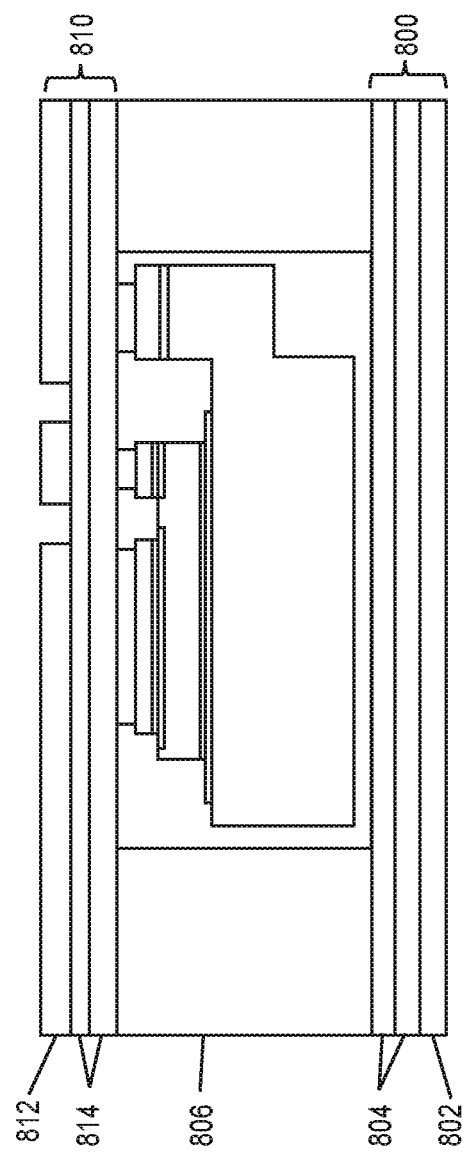

FIG. 8D shows a second PCB laminate 810 covering the molded power module 400 and the additional prepreg layer 806 with the opening 808. The second PCB laminate 810 that includes a Cu foil 812 and one or more prepreg layers 814 each of which comprises a PCB dielectric such as FR4. The Cu foil 812 of the second PCB laminate 810 may be patterned to provide adequate isolation between the different electric potentials and control signalling of the molded power module 400.

Figure 8E:
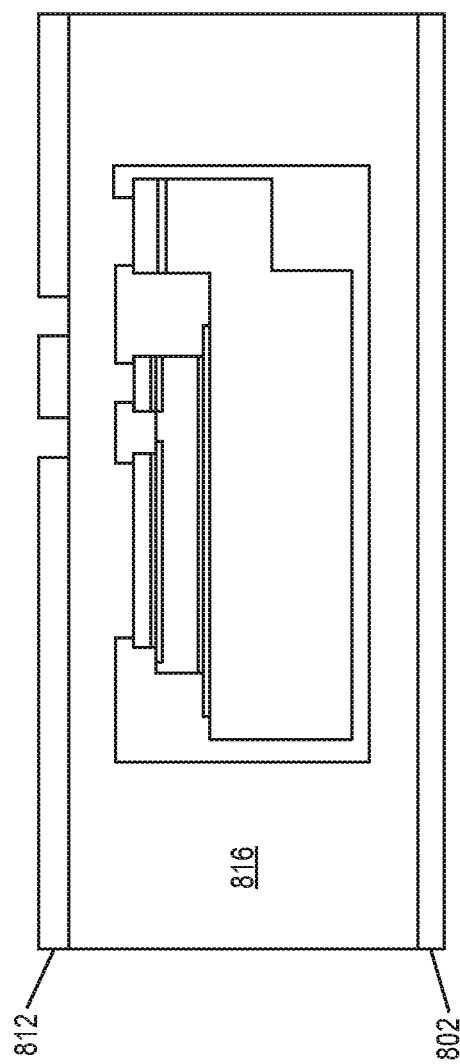

FIG. 8E shows the stacked structure after a lamination process which may include elevated temperature, e.g., 130-150° C., elevated pressure, e.g., 3 MPa, and vacuum. The lamination process cures the PCB dielectrics of the prepreg layers 804, 806, 814 to form an electrically insulating body 816 of the PCB and in which the molded power module 400 is embedded. More than one molded power module may be embedded in the electrically insulating body 816.

Figure 8F:
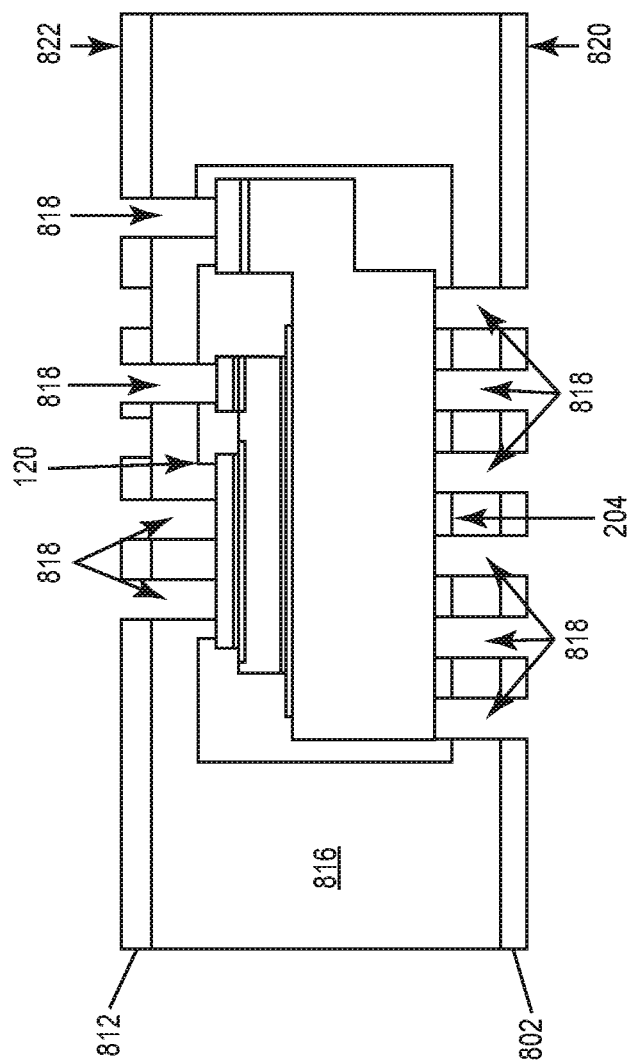

FIG. 8F shows openings 818 formed in the Cu foils 802, 812 and the electrically insulating body 816 of the PCB. The openings 818 may be formed by laser drilling, mechanical drilling, etc. The openings 818 at the bottom side 820 of the PCB may be formed at the same time or at a different time as the openings 818 at the top side 822 of the PCB. The openings 818 at the bottom side 820 of the PCB expose the unmolded back side 204 of the molded power module 400.

The openings 818 at the top side 822 of the PCB expose contact regions of the respective module terminals 118, 124, 134 at the front side 120 of the power module 400. Three exposed terminals 118, 124, 134 are shown at the front side 120 of the power module 400 in FIG. 8F. The molded power module 400 may have more terminals that can be exposed through the openings 818, as previously explained herein.

The molded power module 400 may have a terminal coplanarity of +/−30 μm at the module front side 120, as previously described herein. Accordingly, the openings 814 at the top side 822 of the PCB have a relatively uniform depth (e.g., 50 microns). The module terminals 118, 124, 134 protect the underlying metal contact pads 110, 112 of the power semiconductor die 104 from being damaged by the laser/mechanical via drilling process used to form the openings 818.

Figure 8G:
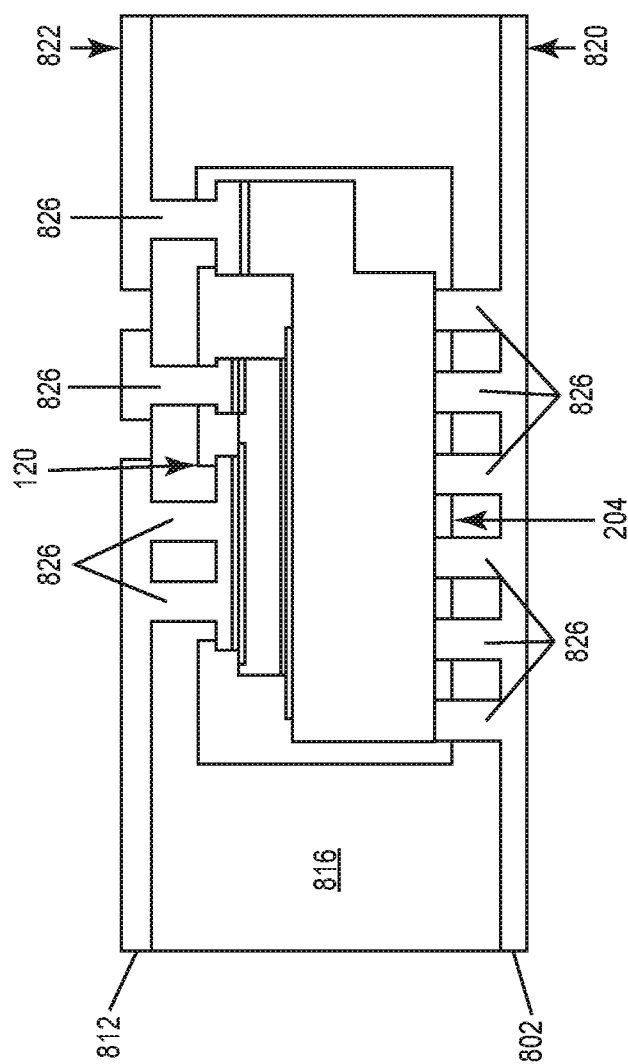

FIG. 8G shows the openings 818 filled with an electrically conductive material 826 such as Cu, e.g., using an electroless Cu plating process. The electrically conductive material 826 at the top side of the PCB may form vias that connect the different sections of the patterned Cu foil 812 to the contact regions of the respective module terminals 118, 124, 134. That is, the vias formed by the electrically conductive material 826 extend through the upper part of the electrically insulating body 816 of the PCB and contact the first terminal 118, the second terminal 124 and the third terminal 134 of the molded power module 400. The electrically conductive material 826 at the bottom side of the PCB may similar form vias that connect the bottom Cu foil 802 to the unmolded back side 204 of the molded power module 400.

The PCB lamination process may be continued to form one or more additional PCB layers above and/or below the electrically insulating body 816 of the PCB in which the molded power module 400 is embedded. Each additional PCB layer may be used to provide additional levels of electrical interconnection and/or redistribution. Components such as drivers, controllers, passives (inductors, capacitors, etc.), coolers, etc. may be attached to the uppermost layer of the PCB and electrically connected to the molded power module 400 embedded therein to form an electronic circuit such as a multi-phase phase drive for power steering, climate compressors, power converters, power inverters, etc.

As explained above, the power semiconductor dies included in the power modules may have a thickness less than 100 µm and the first load terminal, the second load terminal and the control terminal of the power semiconductor dies may each comprise Cu and have a thickness less than 10 µm. The power modules embedded in the PCB may be molded or unmolded power modules, e.g., as shown in FIGS. 1 through 4. The first metal clip of the power modules may have a plurality of slots configured as a reservoir for accommodating solder paste used to solder the first metal clip to the first load terminal of the respective power semiconductor die, e.g., as shown in FIG. 5E. Separately or in combination, the second metal clip of the power modules may have one or more slots configured as a reservoir for accommodating solder paste used to solder the second metal clip to the control terminal of the power semiconductor die, e.g., as shown in FIG. 5E.

Although the present disclosure is not so limited, the following numbered examples demonstrate one or more aspects of the disclosure.

Example 1. A method of batch producing power modules, the method comprising: applying a first solder paste to substrate sections of a leadframe structure; placing a plurality of power semiconductor dies on the first solder paste, each power semiconductor die having a first load terminal and a control terminal at a first side that faces away from the leadframe structure and a second load terminal contacting the first solder paste at a second side opposite the first side; applying a second solder paste to the first load terminal and the control terminal of each power semiconductor die; vertically aligning a metal clip frame with the leadframe structure, the metal clip frame comprising a first metal clip vertically aligned with the first load terminal of each power semiconductor die and a second metal clip vertically aligned with the control terminal of each power semiconductor die; pressing the metal clip frame toward the leadframe structure in a pressing direction, wherein a hard stop feature prevents further pressing when the hard stop feature is engaged; reflowing the first solder paste and the second solder paste to form a first soldered joint between each first metal clip and the corresponding first load terminal of each power semiconductor die, a second soldered joint between each second metal clip and the corresponding control terminal of each power semiconductor die, and a third soldered joint between the second load terminal of each power semiconductor die and the corresponding substrate section of the leadframe structure; and severing connections to the leadframe structure and to the metal clip frame, to form individual power modules.

Example 2. The method of example 1, wherein each power semiconductor die has a thickness less than 100 µm, and wherein the first load terminal, the second load terminal and the control terminal of each power semiconductor die comprise Cu and have a thickness less than 10 µm.

Example 3. The method of example 1 or 2, wherein the first terminal, the second terminal and the third terminal of each power module are coplanar within +/−30 µm at the first side of the power module.

Example 4. The method of any of examples 1 through 3, wherein the hard stop feature determines a bond line thickness for each first soldered joint, each second soldered joint, and each third soldered joint.

Example 5. The method of any of examples 1 through 5, wherein the hard stop feature comprises a plurality of protrusions at a side of the metal clip frame that faces the leadframe structure when the metal clip frame is vertically aligned with the leadframe structure.

Example 6. The method of any of examples 1 through 5, wherein the hard stop feature comprises a plurality of protrusions at a side of the leadframe structure that faces the metal clip frame when the metal clip frame is vertically aligned with the leadframe structure.

Example 7. The method of any of examples 1 through 6, wherein the hard stop feature comprises a plurality of tabs that protrude downward from a periphery of the metal clip frame in a direction toward the leadframe structure when the metal clip frame is vertically aligned with the leadframe structure.

Example 8. The method of any of examples 1 through 7, wherein the hard stop feature limits movement of the metal clip frame in at least one lateral direction that is orthogonal to the pressing direction, when the metal clip frame is pressed onto the leadframe structure.

Example 9. The method of any of examples 1 through 8, wherein each first metal clip of the metal clip frame has a plurality of slots configured as a reservoir for accommodating the second solder paste during the pressing and the reflowing.

Example 10. The method of any of examples 1 through 9, wherein each second metal clip of the metal clip frame has one or more slots configured as a reservoir for accommodating the second solder paste during the pressing and the reflowing.

Example 11. The method of any of examples 1 through 10, further comprising: prior to severing the connections to the leadframe structure and to the metal clip frame, molding the power modules.

Example 12. A method of producing an electronic assembly, the method comprising: embedding a power module in an electrically insulating body of a printed circuit board, the power module comprising: a leadframe; a power semiconductor die having a first load terminal and a control terminal at a first side of the power semiconductor die and a second load terminal at a second side opposite the first side, the second load terminal being soldered to the leadframe; a first metal clip soldered to the first load terminal and forming a first terminal of the power module at a first side of the power module; and a second metal clip soldered to the control terminal and forming a second terminal of the power module at the first side of the power module, wherein the leadframe extends to the first side of the power module and forms a third terminal of the power module at the first side of the power module, or a third metal clip is soldered to the leadframe and forms the third terminal of the power module; forming a plurality of openings in the electrically insulating body of the printed circuit board that expose the first terminal, the second terminal and the third terminal of the power module at the first side of the power module; and filling the plurality of openings with an electrically conductive material.

Example 13. The method of example 12, wherein the openings are formed in the electrically insulating body of the printed circuit board by laser drilling, wherein the power semiconductor die has a thickness less than 100 µm, and wherein the first load terminal, the second load terminal and the control terminal of the power semiconductor die each comprise Cu and have a thickness less than 10 µm.

Example 14. The method of example 12 or 13, wherein the first terminal, the second terminal and the third terminal of the power module are coplanar within +/−30 μm at the first side of the power module.

Example 15. The method of any of examples 12 through 14, wherein the power module is a molded module.

Example 16. The method of any of examples 12 through 15, wherein the first metal clip of the power module has a plurality of slots configured as a reservoir for accommodating solder paste used to solder the first metal clip to the first load terminal of the power semiconductor die.

Example 17. The method of any of examples 12 through 16, wherein the second metal clip of the power module has one or more slots configured as a reservoir for accommodating solder paste used to solder the second metal clip to the control terminal of the power semiconductor die.

Example 18. A power electronic assembly, comprising: a printed circuit board (PCB); and a power module embedded in the PCB, wherein the power module comprises: a leadframe; a power semiconductor die having a first load terminal and a control terminal at a first side of the power semiconductor die and a second load terminal at a second side opposite the first side, the second load terminal being soldered to the leadframe; a first metal clip soldered to the first load terminal and forming a first terminal of the power module at a first side of the power module; and a second metal clip soldered to the control terminal and forming a second terminal of the power module at the first side of the power module, wherein the leadframe extends to the first side of the power module and forms a third terminal of the power module at the first side of the power module, or a third metal clip is soldered to the leadframe and forms the third terminal of the power module, wherein the PCB includes electrically conductive vias that extend through one or more insulating layers of the PCB and contact the first terminal, the second terminal and the third terminal of the power module at the first side of the power module.

Example 19. The power electronic assembly of example 18, wherein the first terminal, the second terminal and the third terminal of the power module are coplanar within +/−30 μm at the first side of the power module.

Example 20. The power electronic assembly of example 18 or 19, wherein the power module is a molded module.

Example 21. The power electronic assembly of any of examples 18 through 20, wherein the first metal clip of the power module has a plurality of slots configured as a reservoir for accommodating solder paste used to solder the first metal clip to the first load terminal of the power semiconductor die.

Example 22. The power electronic assembly of any of examples 18 through 21, wherein the second metal clip of the power module has one or more slots configured as a reservoir for accommodating solder paste used to solder the second metal clip to the control terminal of the power semiconductor die.

Example 23. A power module for embedding in a printed circuit board (PCB), the power module comprising: a leadframe; a power semiconductor die having a first load terminal and a control terminal at a first side of the power semiconductor die and a second load terminal at a second side opposite the first side, the second load terminal being soldered to the leadframe; a first metal clip soldered to the first load terminal and forming a first terminal of the power module at a first side of the power module; and a second metal clip soldered to the control terminal and forming a second terminal of the power module at the first side of the power module, wherein the leadframe extends to the first side of the power module and forms a third terminal of the power module at the first side of the power module, or a third metal clip is soldered to the leadframe and forms the third terminal of the power module, wherein the first terminal, the second terminal and the third terminal of the power module are coplanar within +/−30 μm at the first side of the power module.

Example 24. The power module of example 23, wherein the first metal clip has a plurality of slots configured as a reservoir for accommodating solder paste used to solder the first metal clip to the first load terminal of the power semiconductor die.

Example 25. The power module of example 23 or 24, wherein the second metal clip has one or more slots configured as a reservoir for accommodating solder paste used to solder the second metal clip to the control terminal of the power semiconductor die.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of batch producing power modules, the method comprising:
   applying a first solder paste to substrate sections of a leadframe structure, wherein each substrate section belongs to a different one of the power modules;
   placing a power semiconductor die on the first solder paste of each substrate section, each power semiconductor die having a first load terminal and a control terminal at a first side that faces away from the leadframe structure and a second load terminal contacting the first solder paste at a second side opposite the first side;
   applying a second solder paste to the first load terminal and the control terminal of each power semiconductor die;
   vertically aligning a metal clip frame with the leadframe structure, the metal clip frame comprising a first metal clip vertically aligned with the first load terminal of each power semiconductor die and a second metal clip vertically aligned with the control terminal of each power semiconductor die;
   pressing the metal clip frame toward the leadframe structure in a pressing direction, wherein a hard stop feature prevents further pressing when the hard stop feature is engaged;
   reflowing the first solder paste and the second solder paste to form a first soldered joint between each first metal clip and the corresponding first load terminal of each power semiconductor die, a second soldered joint between each second metal clip and the corresponding control terminal of each power semiconductor die, and a third soldered joint between the second load terminal of each power semiconductor die and the corresponding substrate section of the leadframe structure; and severing connections to the leadframe structure and to the metal clip frame, to form individual power modules.

2. The method of claim 1, wherein each power semiconductor die has a thickness less than 100 µm, and wherein the first load terminal, the second load terminal and the control terminal of each power semiconductor die comprise Cu and have a thickness less than 10 µm.

3. The method of claim 1, wherein the first terminal, the second terminal and the third terminal of each power module are coplanar within +/−30 µm at the first side of the power module.

4. The method of claim 1, wherein the hard stop feature determines a bond line thickness for each first soldered joint, each second soldered joint, and each third soldered joint.

5. The method of claim 1, wherein the hard stop feature comprises a plurality of protrusions at a side of the metal clip frame that faces the leadframe structure when the metal clip frame is vertically aligned with the leadframe structure.

6. The method of claim 1, wherein the hard stop feature comprises a plurality of protrusions at a side of the leadframe structure that faces the metal clip frame when the metal clip frame is vertically aligned with the leadframe structure.

7. The method of claim 1, wherein the hard stop feature comprises a plurality of tabs that protrude downward from a periphery of the metal clip frame in a direction toward the leadframe structure when the metal clip frame is vertically aligned with the leadframe structure.

8. The method of claim 1, wherein the hard stop feature limits movement of the metal clip frame in at least one lateral direction that is orthogonal to the pressing direction, when the metal clip frame is pressed onto the leadframe structure.

9. The method of claim 1, wherein each first metal clip of the metal clip frame has a plurality of slots configured as a reservoir for accommodating the second solder paste during the pressing and the reflowing.

10. The method of claim 1, wherein each second metal clip of the metal clip frame has one or more slots configured as a reservoir for accommodating the second solder paste during the pressing and the reflowing.

11. The method of claim 1, further comprising:

prior to severing the connections to the leadframe structure and to the metal clip frame, molding the power modules.

12. A method of producing an electronic assembly, the method comprising:

embedding a power module in an electrically insulating body of a printed circuit board, the power module comprising: a leadframe; a power semiconductor die having a first load terminal and a control terminal at a first side of the power semiconductor die and a second load terminal at a second side opposite the first side, the second load terminal being soldered to the leadframe; a first metal clip soldered to the first load terminal and forming a first terminal of the power module at a first side of the power module; and a second metal clip soldered to the control terminal and forming a second terminal of the power module at the first side of the power module, wherein the leadframe extends to the first side of the power module and forms a third terminal of the power module at the first side of the power module, or a third metal clip is soldered to the leadframe and forms the third terminal of the power module;

forming a plurality of openings in the electrically insulating body of the printed circuit board that expose the first terminal, the second terminal and the third terminal of the power module at the first side of the power module; and filling the plurality of openings with an electrically conductive material.

13. The method of claim 12, wherein the openings are formed in the electrically insulating body of the printed circuit board by laser drilling, wherein the power semiconductor die has a thickness less than 100 µm, and wherein the first load terminal, the second load terminal and the control terminal of the power semiconductor die each comprise Cu and have a thickness less than 10 µm.

14. The method of claim 12, wherein the first terminal, the second terminal and the third terminal of the power module are coplanar within +/−30 µm at the first side of the power module.

15. The method of claim 12, wherein the power module is a molded module.

16. The method of claim 12, wherein the first metal clip of the power module has a plurality of slots configured as a reservoir for accommodating solder paste used to solder the first metal clip to the first load terminal of the power semiconductor die.

17. The method of claim 12, wherein the second metal clip of the power module has one or more slots configured as a reservoir for accommodating solder paste used to solder the second metal clip to the control terminal of the power semiconductor die.

* * * * *